(12) United States Patent
Brolin

(10) Patent No.: US 7,990,853 B2
(45) Date of Patent: Aug. 2, 2011

(54) LINK AGGREGATION WITH INTERNAL LOAD BALANCING

(75) Inventor: Stephen J. Brolin, Livingston, NJ (US)

(73) Assignee: Fujitsu Limited, Kawasaki (JP)

( * ) Notice: Subject to any disclaimer, the term of this patent is extended or adjusted under 35 U.S.C. 154(b) by 578 days.

(21) Appl. No.: 11/637,041

(22) Filed: Dec. 12, 2006

(65) Prior Publication Data
US 2007/0133618 A1 Jun. 14, 2007

Related U.S. Application Data

(60) Provisional application No. 60/749,577, filed on Dec. 13, 2005.

(51) Int. Cl.
*H04L 12/16* (2006.01)
*H04L 12/26* (2006.01)
*H04L 12/28* (2006.01)
*H04L 1/00* (2006.01)

(52) U.S. Cl. .............. 370/229; 370/230.1; 370/235.1; 370/235

(58) Field of Classification Search .......... 370/229, 370/230, 230.1, 231, 232, 233, 234, 235, 370/235.1, 236, 236.1, 236.2, 237, 238, 238.1, 370/239, 240; 709/238, 230, 231, 235, 236, 709/237
See application file for complete search history.

(56) References Cited

U.S. PATENT DOCUMENTS

| 4,046,193 A | 9/1977 | Dougherty |
| 4,557,225 A | 12/1985 | Sagues |
| 4,720,850 A | 1/1988 | Oberlander |
| 4,858,069 A | 8/1989 | Hughes |
| 5,105,336 A | 4/1992 | Jacoby |
| 5,280,191 A | 1/1994 | Chang |

(Continued)

FOREIGN PATENT DOCUMENTS

KR 2004063453 7/2004

OTHER PUBLICATIONS

IEEE Std 802.3ad-2000, "Aggregation of Multiple Link Segments", Mar. 30, 2000, IEEE, all pages.*

(Continued)

*Primary Examiner* — Kwang B Yao
*Assistant Examiner* — Adam Duda
(74) *Attorney, Agent, or Firm* — Murphy & King, P.C.

(57) ABSTRACT

A system and method provides Link Aggregation that internalizes the link aggregation to improve internal traffic capacity, in addition to sharing traffic across external links to connecting packet systems. A system for handling data traffic comprises a plurality of network switches, each network switch having an interface to a packet network, the interface arranged so as to provide at least one link aggregation group, an interface to at least one other network switch, and an interface to each of a plurality of optical network service units, a plurality of optical network service units, each optical network service units having an interface to each of the plurality of network switches and an interface to at least one optical network, wherein each network switch is operable to receive data over a link aggregation group from the packet network and transmit the data to at least one optical network service unit either directly or via another network switch based on an optical network to which the data is destined (or other criteria) Also, each optical network service unit can send upstream data to any port of either network switch- via selected internal paths.

3 Claims, 5 Drawing Sheets

U.S. PATENT DOCUMENTS

| | | | |
|---|---|---|---|
| 5,636,215 | A | 6/1997 | Kubo |
| 5,748,445 | A | 5/1998 | North |
| 5,812,373 | A | 9/1998 | Hwang |
| 5,812,528 | A | 9/1998 | VanDervort |
| 5,825,621 | A | 10/1998 | Giannatto |
| 5,829,514 | A | 11/1998 | Smith |
| 5,831,830 | A | 11/1998 | Mahler |
| 5,867,494 | A | 2/1999 | Krishnaswamy |
| 5,867,495 | A | 2/1999 | Elliott |
| 5,953,207 | A | 9/1999 | Aakalu |
| 6,002,585 | A | 12/1999 | Leeb |
| 6,038,129 | A | 3/2000 | Falaki |
| 6,047,002 | A | 4/2000 | Hartmann |
| 6,101,090 | A | 8/2000 | Gates |
| 6,434,000 | B1 | 8/2002 | Pandolfi |
| 6,532,088 | B1 | 3/2003 | Dantu |
| 6,614,758 | B2 * | 9/2003 | Wong et al. .................. 370/232 |
| 6,621,818 | B1 | 9/2003 | Szczepanek |
| 6,671,818 | B1 | 12/2003 | Mikurak |
| 6,711,013 | B2 | 3/2004 | Wobig |
| 6,789,191 | B1 | 9/2004 | Lapstun |
| 6,972,959 | B2 | 12/2005 | Asai |
| 6,985,467 | B2 | 1/2006 | Lomp et al. |
| 7,020,111 | B2 | 3/2006 | Ozluturk et al. |
| 7,046,679 | B2 | 5/2006 | Sampath |
| 7,085,281 | B2 | 8/2006 | Thomas et al. |
| 7,095,611 | B2 | 8/2006 | Kunz |
| 7,103,807 | B2 | 9/2006 | Bosa |
| 7,124,101 | B1 | 10/2006 | Mikurak |
| 7,133,415 | B2 | 11/2006 | Zelig |
| 7,154,755 | B2 | 12/2006 | Araujo |
| 7,158,380 | B2 | 1/2007 | Green |
| 7,245,628 | B2 | 7/2007 | Shi et al. |
| 7,277,443 | B2 | 10/2007 | Goode |
| 7,283,519 | B2 | 10/2007 | Girard |
| 7,322,850 | B2 | 1/2008 | Neer |
| 7,376,136 | B2 | 5/2008 | Song |
| 7,403,477 | B2 | 7/2008 | Takeuchi et al. |
| 7,428,211 | B2 | 9/2008 | Yu |
| 7,492,719 | B2 | 2/2009 | Lim |
| 7,512,147 | B2 | 3/2009 | Sato |
| 7,599,620 | B2 | 10/2009 | Graves |
| 2002/0059637 | A1 | 5/2002 | Rakib |
| 2002/0085548 | A1 | 7/2002 | Ku |
| 2002/0141159 | A1 | 10/2002 | Bloemen |
| 2002/0196792 | A1 | 12/2002 | McNeil |
| 2002/0196811 | A1 | 12/2002 | Park |
| 2003/0026074 | A1 | 2/2003 | Clements |
| 2003/0050002 | A1 | 3/2003 | Pfister |
| 2003/0091267 | A1 | 5/2003 | Alvarez |
| 2004/0007348 | A1 | 1/2004 | Stoller |
| 2004/0064351 | A1 | 4/2004 | Mikurak |
| 2004/0107169 | A1 | 6/2004 | Lowe |
| 2004/0177161 | A1 | 9/2004 | Hoang |
| 2004/0190548 | A1 | 9/2004 | Harel |
| 2004/0202470 | A1 | 10/2004 | Lim |
| 2005/0008013 | A1 | 1/2005 | Jamieson |
| 2005/0013314 | A1 | 1/2005 | Lim |
| 2005/0099949 | A1 | 5/2005 | Mohan |
| 2005/0100015 | A1 | 5/2005 | Eubanks |
| 2005/0180749 | A1 | 8/2005 | Koley |
| 2005/0198247 | A1 | 9/2005 | Perry |
| 2006/0098578 | A1 | 5/2006 | Mallya |
| 2006/0120389 | A1 | 6/2006 | Sampath |
| 2006/0209825 | A1 | 9/2006 | Carroll et al. |
| 2006/0285536 | A1 * | 12/2006 | Pauwels et al. ............... 370/352 |
| 2007/0025370 | A1 | 2/2007 | Ghasem et al. |
| 2007/0070997 | A1 | 3/2007 | Weitz et al. |
| 2007/0109974 | A1 | 5/2007 | Cutillo et al. |
| 2007/0136743 | A1 | 6/2007 | Hasek |
| 2007/0136777 | A1 | 6/2007 | Hasek |
| 2008/0068807 | A1 | 3/2008 | Horng |

OTHER PUBLICATIONS

Paul Congdon, "Load Balancing Algorithms", Feb. 4, 1998, IEEE Aggregate Study Group, all pages.*
International Search Report and a Written Opinion issued on Oct. 31, 2008 in the corresponding International PCT/US2006/047374 application.
Final Office Action dated Sep. 30, 2009 issued in U.S. Appl. No. 11/637,037.
Non-Final Office Action dated Mar. 11, 2009 issued in U.S. Appl. No. 11/637,037.
Non-Final Office Action dated May 7, 2009 issued in U.S. Appl. No. 11/637,023.
Final Office Action dated Dec. 3, 2009 issued in U.S. Appl. No. 11/637,023.
Non-Final Office Action dated Apr. 17, 2008 issued in U.S. Appl. No. 11/637,840.
Notice of Allowance dated Aug. 13, 2008 issued in U.S. Appl. No. 11/637,840.
Final Office Action dated Oct. 16, 2009 issued in U.S. Appl. No. 11/637,808.
Non-Final Office Action dated May 5, 2009 issued in U.S. Appl. No. 11/637,808.
Notice of Allowance dated Nov. 9, 2009 issued in U.S. Appl. No. 11/637,842.
Non-Final Office Action dated May 14, 2009 issued in U.S. Appl. No. 11/637,842.
Non-Final Office Action dated Apr. 2, 2009 issued in U.S. Appl. No. 11/637,807.
Non-Final Office Action dated Sep. 16, 2009 issued in U.S. Appl. No. 11/637,807.
Final Office Action dated Feb. 1, 2010 received in U.S. Appl. No. 11/637,807.
Non-Final Office Action dated Feb. 24, 2010 received in U.S. Appl. No. 11/637,808.
Non-Final Office Action dated May 18, 2010 received in U.S. Appl. No. 11/637,023.
Notice of Allowance dated Jun. 24, 2010 received in U.S. Appl. No. 11/637,037.
Final Office Action dated Jul. 20, 2010 received in U.S. Appl. No. 11/637,808.
International Search Report received in PCT/US06/47379 dated Feb. 19, 2008.
Notice of Allowance dated Sep. 23, 2010 received in U.S. Appl. No. 11/637,808.
Non-Final Office Action dated Nov. 10, 2010 received in U.S. Appl. No. 11/637,807.
Notice of Allowance dated Sep. 16, 2010 received in U.S. Appl. No. 11/637,037.
Final Office Action dated Dec. 3, 2010 received in U.S. Appl. No. 11/637,023.
Supplemental Notice of Allowability dated Oct. 19, 2010 received in U.S. Appl. No. 11/637,037.
Non-Final Office Action dated Jan. 7, 2011 received in U.S. Appl. No. 11/637,841.
Non-Final Office Action dated Mar. 14, 2011 received in U.S. Appl. No. 11/637,023.
Final Office Action dated May 10, 2011 received in U.S. Appl. No. 11/637,841.

* cited by examiner

LINK AGGREGATION WITH INTERNAL LOAD BALANCING

CROSS-REFERENCE TO RELATED APPLICATIONS

This application claims the benefit of provisional application 60/749,577, filed Dec. 13, 2005, the entirety of which is incorporated herein by reference.

BACKGROUND OF THE INVENTION

1. Field of the Invention

The present invention relates to a system and method providing for link aggregation features of protection and extra bandwidth, while reducing traffic congestion within the system, in a way not visible to an external packet network.

2. Background of the Prior Art

A Passive Optical Network (PON) is a point-to-multipoint, fiber to the premises network architecture in which unpowered optical splitters are used to enable a single optical fiber to serve multiple premises, typically 32. A PON consists of an Optical Line Termination (OLT) typically at the service provider's central office and a number of Optical Network Units (ONUs) near end users. A PON configuration reduces the amount of fiber and central office equipment required compared with point to point architectures. Downstream signals are broadcast to each premises sharing a fiber. Encryption is used to prevent eavesdropping. Upstream signals are combined using a multiple access protocol, typically time division multiple access (TDMA). The OLTs "range" the ONUs in order to provide time slot assignments for upstream communication and to equalize roundtrip transmission delay between the ONU's on a PON and the OLT.

There are a number of standard types of PON that have been implemented. APON (ATM Passive Optical Network) was the first Passive optical network standard. It was used primarily for business applications, and was based on ATM. BPON (Broadband PON) is a standard based on APON. It adds support for WDM, dynamic and higher upstream bandwidth allocation, and survivability. GPON (Gigabit PON) is an evolution of BPON. It supports higher rates, enhanced security, and choice of Layer 2 protocol (ATM, GEM, Ethernet). GPON represents a significant boost in both the total bandwidth and bandwidth efficiency through the use of larger, variable-length packets. A GPON network delivers up to 2,488 megabits per second (Mbit/s) of downstream bandwidth, and 2,488 Mbit/s of upstream bandwidth. GPON Encapsulation Method (GEM) allows very efficient packaging of user traffic, with frame segmentation to allow for higher Quality of Service (QoS) for delay-sensitive traffic such as voice and video communications.

Among the features of GPON is Link Aggregation. Link Aggregation involves aggregating a plurality of links to form a group of links that may be treated as a single link for most purposes. Current implementations of Link Aggregation provide this function only at the external facing ports of a system to a connecting system. In this invention, the link aggregation function not only provides this capability, but internalizes the functionality to provide improved traffic handling throughout the internals of the system.

SUMMARY OF THE INVENTION

The present invention provides a system and method for providing Link Aggregation that internalizes the benefits of link aggregation to provide improved traffic handling throughout the internals of the system, in addition to the usual functionality on external facing ports.

A system for handling data traffic comprises a plurality of network switches, each network switch having an interface to a packet network, the interface arranged so as to provide at least one link aggregation group, an interface to at least one other network switch, and an interface to each of a plurality of optical network service units, a plurality of optical network service units, each optical network service units having an interface to each of the plurality of network switches and an interface to at least one optical network, wherein, downstream, each network switch is operable to receive data over a link aggregation group from the packet network and transmit the data to at least one optical network service unit either directly or via another network switch based on an optical network to which the data is destined.

Upstream, each network switch may be further operable to receive data from at least one optical network service unit and transmit the data to the packet network over the link aggregation group. Each network switch may be further operable to distribute the data across the network switches and the interface to the packet network based on data traffic demand and congestion.

A system for handling data traffic comprises a first network switch having an interface to a packet network, the interface arranged so as to provide at least a portion of at least one link aggregation group, an interface to a second network switch, and an interface to each of a plurality of optical network service units, the second network switch having an interface to the packet network, the interface arranged so as to provide at least a portion of at least one link aggregation group, an interface to the first network switch, and an interface to each of a plurality of optical network service units, and a plurality of optical network service units, each optical network service units having an interface to each of the network switches and an interface to at least one optical network, wherein data in the link aggregation group that is destined for a first optical network is received by both the first network switch and the second network switch, the data that is received by the first network switch is transmitted to an optical network service unit from the first network switch, and the data that is received by the second network switch is transmitted to the optical network service unit via the first network switch. Per FIG. 1, either network switch can send data to any network service unit directly, or thru the other network switch, where the switching path will be selected to best balance internal traffic.

Data in the link aggregation group that is destined for a second optical network may be received by both the first network switch and the second network switch, the data that is received by the second network switch is transmitted to the optical network service units from the second network switch, and the data that is received by the first network switch is transmitted to the optical network service unit via the second network switch. Each network switch may be further operable to receive data from at least one optical network service unit and transmit the data to the packet network over the link aggregation group. Each network switch may be further operable to distribute the data across the network switches and the interface to the packet network based on data traffic demand and congestion.

DETAILED DESCRIPTION OF THE PREFERRED EMBODIMENTS

The present invention provides a system and method for providing Link Aggregation that does internalizes the link aggregation to obtain improved traffic handling within the system, in addition to the usual benefit if traffic sharing at the external facing ports.

Figure 1:
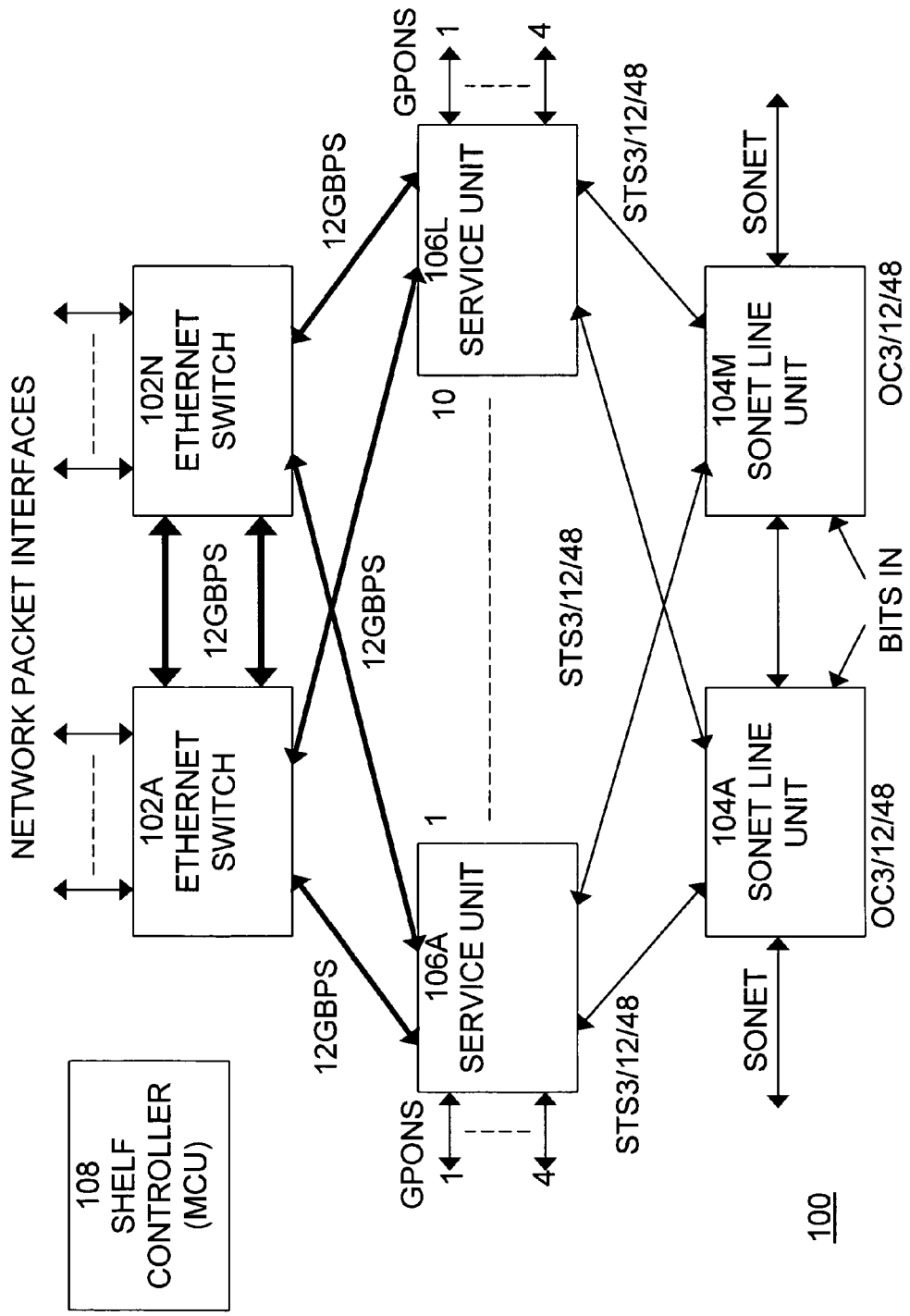
FIG. 1 is an exemplary block diagram of an Optical Line Terminal (OLT) t, in which the present invention may be implemented.

An example of an optical line terminal (OLT) 100, in which the present invention may be implemented, is shown in FIG. 1. Network 100 includes a plurality of switches, such as Ethernet switches 102A-N, a plurality of SONET line units 104A-M, a plurality of service units 106A-L, and shelf controller 108. The OLT 100 provides the interface between the network side data, video, and telephony networks and the GPON networks. The primary function of the OLT 100 is to receive traffic in an IP/Ethernet format and convert it to the GPON format and to receive traffic from the GPON and convert it to IP/Ethernet format. Alternatively, the OLT can convert some traffic from SONET/SDH format to GPON format. At or near the end user, the ONU's convert GPON format to the end user format (Ethernet, IP Multicast, POTS, T1, etc).

A network switch, such as an Ethernet switch 102A-N is a networking device that performs transparent bridging (connection of multiple network segments with forwarding based on MAC addresses) at full wire speed in hardware. The use of specially designed hardware also makes it possible to have large numbers of ports.

SONET line units 104A-M (LUs), provide communication interface with the SONET network, while service units 106A-L (SUs), provide communication with the GPON networks. Each LU 104A-M typically provides timing control, SONET frame pulse reference, and may contain optical interfaces to transmit part or all of the SONET data to the GPON network via the OLT, to supplement data fed directly to the GPON network via the OLT from the packet network.

Figure 2:
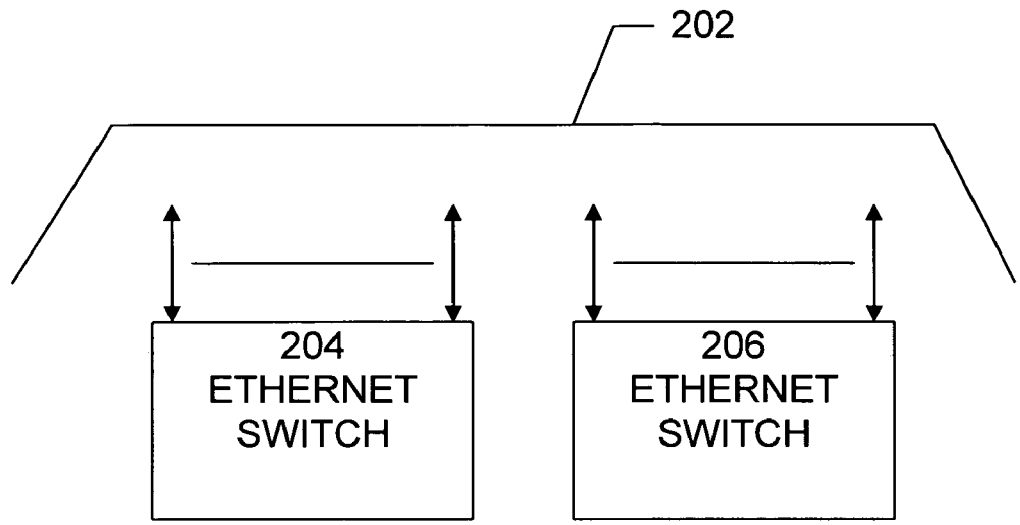
FIG. 2 is an exemplary block diagram of link aggregation groups to packet network interfaces which may be implemented using the present invention.
Figure 3:
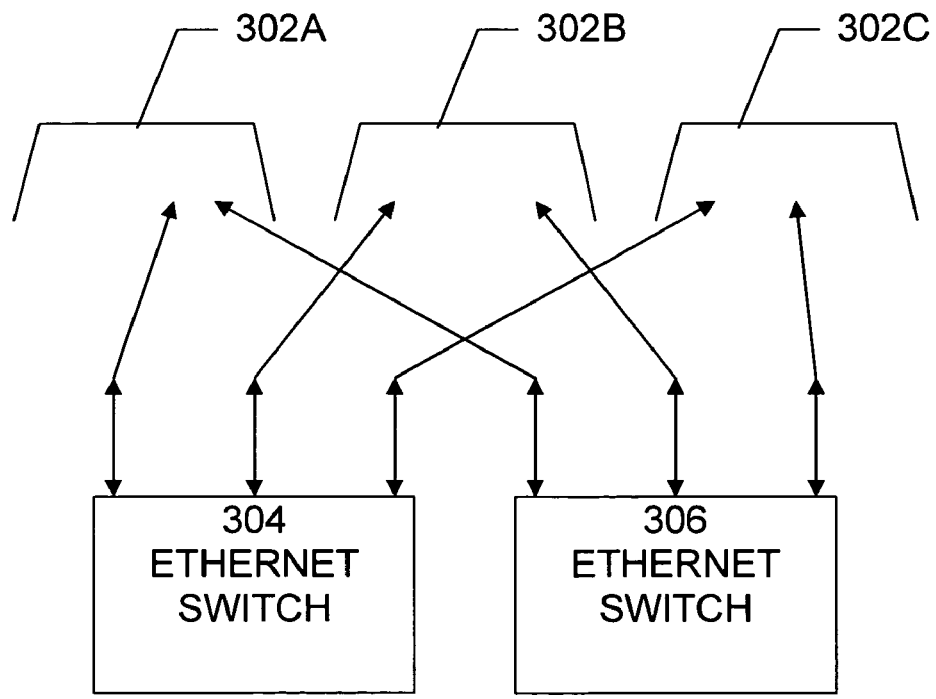
FIG. 3 is an exemplary block diagram of link aggregation groups to packet network interfaces which may be implemented using the present invention.

Exemplary block diagrams of possible link aggregation groups to packet network interfaces are shown in FIGS. 2 and 3. In the example shown in FIG. 2, a single link aggregation group 202 contains all 1 Gigabit Ethernet (GE) or all 10 GE links of both Ethernet Switch Units 204 and 206. In the example shown in FIG. 3, there are multiple link aggregation groups 302A-C, each using a subset of links from each Ethernet Switch Unit 304 and 306. In both cases, each link aggregation group contains an equal number of links from each Ethernet Switch. This allows protection to be provided in case of failure of a link, an Ethernet Switch Unit, or a Packet Network Interface. Also, link aggregation provides additional bandwidth under normal operation, which can provide improved data performance, especially for best effort traffic. All links that are members of the same link aggregation group must have identical link speeds.

Figure 4:
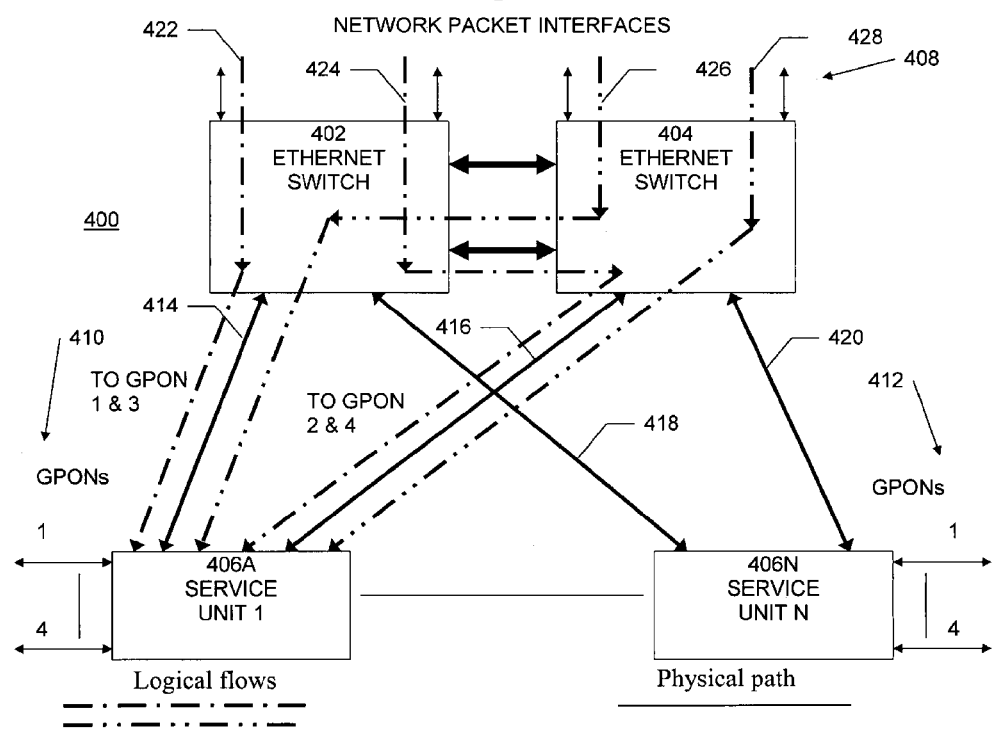
FIG. 4 is a data flow diagram of a system, in which the present invention may be implemented, showing typical downstream direction data flows.

A data flow diagram of a system 400, in which the present invention may be implemented, showing typical downstream direction data flows is shown in FIG. 4. The system includes Ethernet Switch Units 402 and 404 and a plurality of service units 406A-N. The Ethernet Switch Units 402 and 404 interface to an external packet network(not shown) via network packet interfaces, while the service units interface to a plurality of GPONs 410 and 412. The external packet network can distribute packets across multiple links as it chooses. System 400 accepts packets on any interface of a link aggregation group and switches them to an appropriate GPON SU 406A-N interface based on the destination Media Access Control (MAC), Virtual Local Area Network (VLAN), or Internet Protocol (IP) address. Each GPON SU 406A-N has two physical interfaces, one to each Ethernet Switch 402 and 404. For example, service unit 406A has physical interfaces 414 and 416, while service unit 406N has physical interfaces 418 and 420. By distributing traffic among the Ethernet switches 402 and 404 depending on the GPON number (odd or even) (or other criteria) congestion on each backplane link may be reduced under normal operation (when all elements of the link aggregation group are working). For example, logical traffic flow 422, which is destined for service unit 406A, GPONs 1 and 3, is directed by Ethernet switch 402 to service unit 406A, while logical traffic flow 424 which is destined for service unit 406A, GPONs 2 and 4, is directed by Ethernet switch 402 via Ethernet switch 404 to service unit 406A. Likewise, logical traffic flow 426 which is destined for service unit 406A, GPONs 1 and 3, is directed by Ethernet switch 404 via Ethernet switch 402 to service unit 406A, while logical traffic flow 428 which is destined for service unit 406A, GPONs 2 and 4, is directed by Ethernet switch 404 to service unit 406A. When a failure occurs, traffic is redistributed on remaining links or switches, so no services are dropped, but best effort traffic is reduced.

Figure 5:
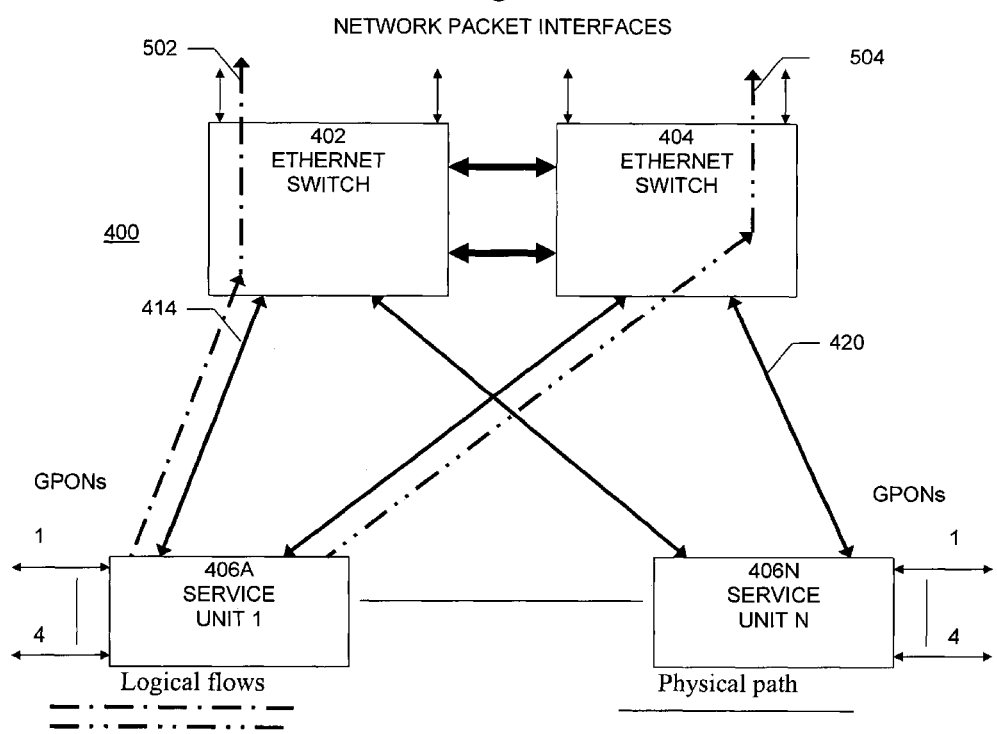
FIG. 5 is a data flow diagram of a system, in which the present invention may be implemented, showing typical upstream direction data flows.

A data flow diagram of system 400, in which the present invention may be implemented, showing typical upstream direction data flows is shown in FIG. 5. Under normal operation system 400 switches packets to the appropriate Ethernet Switch and links to the packet network to best distribute traffic across switches and links based on traffic demand, to minimize congestion. For example, logical traffic flow 502 is directed by service unit 406A to Ethernet switch 402, while logical traffic flow 504 is directed by service unit 406A to Ethernet switch 404. The external packet network only sees its interfaces with the two Ethernet switches 402 and 404.

Figure 6:
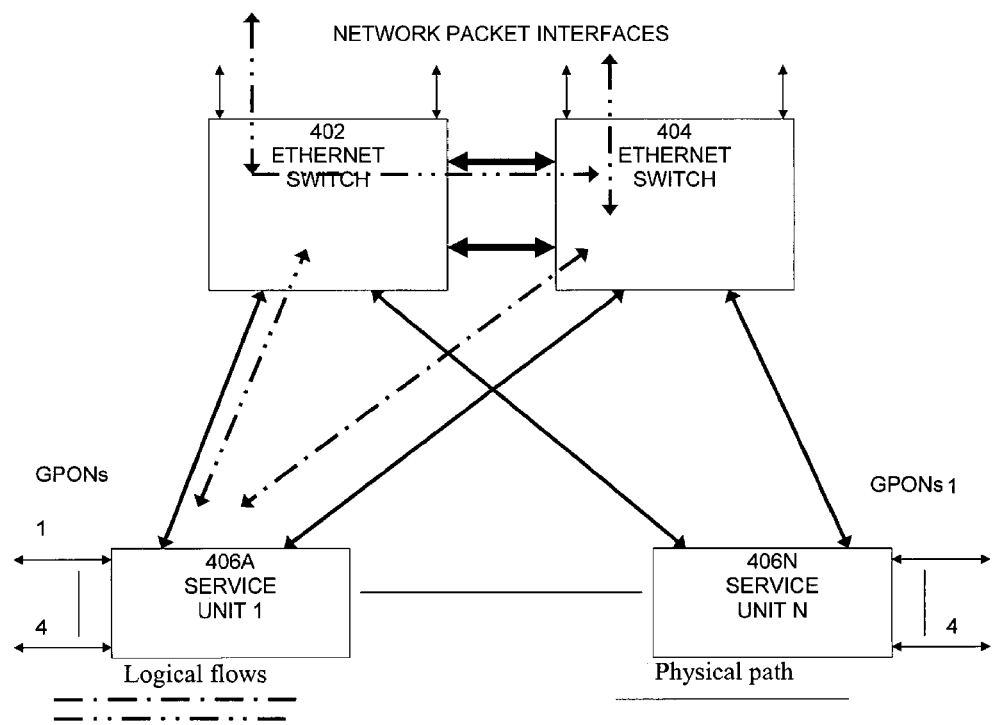
FIG. 6 is a data flow diagram of a system, in which the present invention may be implemented, showing typical protocol layer (management plane) data flows.

A data flow diagram of system 400, in which the present invention may be implemented, showing typical protocol layer (management plane) data flows is shown in FIG. 6. There are two components to the link aggregation management plane:

1. The Ethernet Switches inter-work with the packet network interfaces for external flows.

2. The Ethernet Switches inter-work with the GPON SU's for intra-system traffic flows.

The Ethernet switches 402 and 404 interwork with each other and with the external packet network to create one or more standards-based link aggregation groups. The external packet network is unaware of the GPON SU's 406A-N and the internal architecture of system 400. The Ethernet switches 402 and 404 send control information to the GPON SU's 406A-N on where they statically switch packets based on predicted congestion in the switches and links, so as to best distribute the traffic. In link aggregation, each end of a multi-link trunk can distribute packets across multiple links in any manner it chooses, the far end must accept packets on any link of the aggregation group. Packet distribution is typically static under normal operation, but re-distribution is implemented upon failures (or failure recovery) to best restore service. (Attorney: in general, the arrows in FIG. 6 from switch to service units should be 2 way.)

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

The invention claimed is:

1. A system for handling data traffic comprising:
a plurality of network switches, each network switch having an interface to a packet network, each interface arranged so as to provide at least one link aggregation group, an interface to at least one other network switch, and an interface to each of a plurality of optical network service units; and
a plurality of optical network service units, each of the optical network service units having an interface to each of the plurality of network switches and an interface to each of a plurality of optical networks;
wherein each network switch is arranged so as to transmit and receive data over a link aggregation group from the packet network and transmit and receive the data with at least one optical network service unit by selecting to transmit and receive the data either directly or via another network switch, wherein the selection is based on whether a number of an interface to each of the plurality of optical networks of each of the plurality of optical network service units is odd or even, so as to reduce data traffic congestion.

2. A system for handling data traffic comprising:
a first network switch having an interface to a packet network, the interface arranged so as to provide at least a portion of at least one link aggregation group, an interface to a second network switch, and an interface to each of a plurality of optical network service units;
the second network switch having an interface to the packet network, the interface arranged so as to provide at least a portion of at least one link aggregation group, an interface to the first network switch, and an interface to each of a plurality of optical network service units; and
a plurality of optical network service units, each of the optical network service units having an interface to each of the network switches and an interface to each of a plurality of optical networks;
wherein data in the link aggregation group that is communicated to or from a first optical network is communicated with both the first network switch and the second network switch, and either the first network switch or the second network switch is selected to communicate the data to an optical network service unit based on whether a number of an interface to each of the plurality of optical networks of the optical network service unit is odd or even, so as to reduce data traffic congestion.

3. The system of claim 2, wherein data in the link aggregation group that is destined for a second optical network is received by both the first network switch and the second network switch, the data that is received by the second network switch is transmitted to the optical network service units from the second network switch, and the data that is received by the first network switch is transmitted to the optical network service unit via the second network switch.

* * * * *